United States Patent
Choi et al.

(10) Patent No.: US 7,425,761 B2
(45) Date of Patent: Sep. 16, 2008

(54) METHOD OF MANUFACTURING A DIELECTRIC FILM IN A CAPACITOR

(75) Inventors: Jae-hyoung Choi, Hwaseong-si (KR); Sung-ho Kang, Hwaseong-si (KR); Jung-hee Chung, Suwon-si (KR); Seog-min Lee, Suwon-si (KR); Jong-bom Seo, Yongin-si (KR); Young-min Kim, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 11/544,760

(22) Filed: Oct. 10, 2006

(65) Prior Publication Data

US 2007/0099379 A1 May 3, 2007

(30) Foreign Application Priority Data

Oct. 28, 2005 (KR) .................... 10-2005-0102498

(51) Int. Cl.
*H01L 23/12* (2006.01)
*H01L 23/053* (2006.01)
(52) U.S. Cl. .................... 257/701; 257/306; 257/310; 257/E21.489; 257/E21.547; 257/E21.647
(58) Field of Classification Search ............ 257/701, 257/306, 308, 759, 760, 296, 310, 761, 762, 257/513
See application file for complete search history.

(56) References Cited

U.S. PATENT DOCUMENTS

| 5,872,696 | A | * | 2/1999 | Peters et al. ............... 361/305 |
| 6,656,789 | B2 | * | 12/2003 | Lee et al. .................. 438/253 |
| 7,012,292 | B1 | * | 3/2006 | Van Buskirk et al. ........ 257/295 |
| 7,144,771 | B2 | * | 12/2006 | Nam et al. ................. 438/244 |
| 7,265,410 | B2 | * | 9/2007 | Kang et al. ................ 257/315 |
| 2002/0160559 | A1 | * | 10/2002 | Lee et al. .................. 438/200 |
| 2006/0172498 | A1 | * | 8/2006 | Yamaguchi et al. ......... 438/287 |

FOREIGN PATENT DOCUMENTS

| JP | 2004-023043 | 1/2004 |
| KR | 2004-0058709 | 7/2004 |
| KR | 2005-0067490 | 7/2005 |

* cited by examiner

*Primary Examiner*—David Nhu
(74) *Attorney, Agent, or Firm*—Lee & Morse, P.C.

(57) ABSTRACT

A method of manufacturing a dielectric layer for a capacitor including sequentially supplying and purging a first and a second precursor material for a first and a second predetermined amount of time, respectively, in an initial cycle, sequentially supplying and purging the first and the second precursor materials for a third predetermined amount of time, which is shorter than the first and/or second predetermined amount of time, in a post cycle, which follows the initial cycle, and repeating the initial and post cycles to form a dielectric layer having a predetermined thickness.

20 Claims, 6 Drawing Sheets

FIG. 7

| INITIAL STAGE | MIDDLE STAGE | POST STAGE |

METHOD OF MANUFACTURING A DIELECTRIC FILM IN A CAPACITOR

BACKGROUND OF THE INVENTION

1. Field of the Invention

The present invention relates to a method of manufacturing a dielectric film in a capacitor. In particular, the present invention relates to a method of manufacturing a dielectric film having a crystallization preventing layer between two metal-oxide layers by way of an atomic deposition layer process. The inventive method provides a dielectric film exhibiting excellent electrical properties, while achieving cost-effective throughput.

2. Description of the Related Art

In general, capacitors may have a structure of Metal-Insulator-Metal (MIM) to improve their electrical properties. Among such capacitors, the structure of Tin/$HfO_2$/Tin, as compared, for example, to the structure of Ru/$TaO_2$/Ru, may exhibit low leakage current and high capacitance. As such, capacitors having the structure of Tin/$HfO_2$/Tin may have an advantage of being applied to semiconductor memory devices with a design rule of 100 nm or less. However, the Tin/$HfO_2$/Tin capacitors may have a relatively high leakage current during their back-end processing as a result of the $HfO_2$ layer crystallization.

Typically, crystallization of the $HfO_2$ layer during the back-end processing of the capacitors may be prevented by interposing an $Al_2O_3$ layer between two $HfO_2$ layers as a crystallization preventing layer to form a dielectric film of the structure $HfO_2$/$Al_2O_3$/$HfO_2$. The relatively high crystallization temperature of the $Al_2O_3$ layer may increase the effective crystallization temperature of the overall dielectric film, thereby reducing leakage current during back-end processing even at high processing temperatures.

A dielectric film composed of $HfO_2$/$Al_2O_3$/$HfO_2$ may be formed by an Atomic Layer Deposition (ALD) process to provide a uniform layer deposition on a surface of a lower electrode of a capacitor. Such uniform step coverage and thickness of a dielectric film on the electrode may require increased deposition time of precursor materials; a factor which may result in overall increased processing time of the dielectric film and reduced throughput of the process.

An attempt has been made to increase the throughput of the ALD process, while maintaining good product quality, by employing a batch-type manufacturing process, i.e., depositing films on more than one wafer at a time. However, when the deposition time of the required precursor materials is increased, the resulting overall throughput in such a process is almost indistinguishable over an ALD processing of a single wafer. On the other hand, when the deposition time of the precursor materials is decreased, the precursor materials are not properly applied to the lower electrode of the capacitor, thereby reducing the step coverage of the film and providing inferior wafer thickness and film uniformity, consequently producing an electrically defective capacitor.

Accordingly, there exists a need for a method of manufacturing a dielectric film by an ALD process that produces high quality dielectric films, having excellent step coverage and electrical properties, while providing cost-effective throughput.

SUMMARY OF THE INVENTION

The present invention is therefore directed to a method of manufacturing dielectric films by an ALD process, which substantially overcomes one or more of the problems due to the limitations and disadvantages of the related art.

It is therefore a feature of an embodiment of the present invention to provide a method of manufacturing a dielectric film in a capacitor having excellent electrical properties and reduced leakage current by an ALD process, while providing a cost-effective throughput.

At least one of the above and other features and advantages of the present invention may be realized by providing a method of manufacturing a dielectric layer for a capacitor including sequentially supplying a first precursor material and a second precursor material to a processing chamber in an initial cycle, wherein the supplying is carried out for a first predetermined amount of time and a second predetermined amount of time respectively, and wherein the processing chamber is purged after each supplying is terminated; sequentially supplying the first precursor material and the second precursor material to the processing chamber and purging it in a post cycle, wherein the post cycle follows the initial cycle, and wherein the supplying is carried out for a third predetermined amount of time; and repeating the initial and post cycles to form a first dielectric layer, wherein a number of initial cycles is smaller than a number of post cycles, and wherein a predetermined amount of time of supplying at least one of the precursor materials in the initial cycle is longer than the third predetermined amount of time.

In accordance with the inventive method, supplying of the first and second precursor materials in the initial cycle includes supplying the first and second precursor materials in amounts greater than their corresponding chemical stoichiometric amounts. Similarly, supplying of the first and second precursor materials in the post cycle comprises supplying the first and second precursor materials in amounts equal to or less than their corresponding chemical stoichiometric amounts. This includes supplying at least one of the precursor materials in the initial cycle for the predetermined amount of time of about 100 seconds to about 200 seconds, while the third predetermined amount of time is about 50 seconds to about 100 seconds.

The initial and post cycles are repeated such that the total number of repeated initial cycles is about 5 times to about 10 times smaller than a total number of repeated post cycles. Further, the initial and post cycles are repeated to form a first dielectric layer having a thickness of about 10 Å to about 80 Å, at a temperature of about 150° C. to about 350° C.

The dielectric film may be formed in a batch-type process, where the precursor materials may be pre-treated prior to supplying to the processing chamber, such that the precursor materials are vaporized. Further, the method may include pumping remains of unitary atoms after purging of the vaporized metal and oxidizing agent, where the purging and the pumping are set to correspond to the respective predetermined amounts of time of the vaporized metal and oxidizing agent.

The method may also include repeating the initial and post cycles to form a crystallization preventing layer on top of the first dielectric layer and a second dielectric layer on top of the crystallization preventing layer. The first dielectric layer according to the present invention may be one of $HfO_2$, $ZrO_2$, $Ta_2O_5$, $TiO_2$, STO ($St_xBi_yTiO_x$), or a mixture thereof, where the proper precursor materiasl may be Hf(OtBu)$_4$, Tereakis Ethyl Methyl Amino Hafnium (TEMAH), Tetrakis Di-Methyl Amino Hafnium (TDMAH), Tetrakis Di-Ethyl Amino Hafnium (TDEAH), Zr(OtBu)$_4$, Tetrakis Ethyl Methyl Amino Zirconium (TEMAZ), Tetrakis Di-Ethyl Amino Zirconium (TDMAZ), Tetrakis Di-ethyl Amino Zirconium (TDEAZ), ozone, oxygen, or mixtures thereof.

In another aspect of the present invention, there is provided a method of manufacturing a dielectric film for a capacitor by way of ALD including sequentially supplying a vaporized metal and oxidizing agent to an electrode in an initial cycle, where the supplying is carried out for a first predetermined amount of time and a second predetermined amount of time respectively, and where the vaporized metal and oxidizing agent are purged after the supplying is terminated; sequentially supplying the vaporized metal and oxidizing agent to the electrode in a post cycle, where the post cycle follows the initial cycle, and where the supplying is carried out for a third predetermined amount of time; repeating the initial and post cycles to form a first metal-oxide dielectric layer, wherein a number of initial cycles is smaller than a number of post cycles, and where a predetermined amount of time of supplying at least one of the vaporized metal and oxidizing agent in the initial cycle is longer than the third predetermined amount of time; repeating the initial and post cycles to form a crystallization preventing layer on top of the first metal-oxide dielectric layer, where a number of initial cycles is smaller than a number of post cycles, and where a predetermined amount of time of supplying at least one of the precursor materials in the initial cycle is longer than the third predetermined amount of time; and the post cycles to form a second metal-oxide dielectric layer on top of the crystallization preventing layer.

The inventive method may also include at least one middle cycle between the initial cycle and the post cycle, the middle cycle includes sequentially supplying the vaporized metal and oxidizing agent to the electrode for a fourth predetermined amount of time and purging them, wherein the fourth predetermined amount of time is shorter than any other predetermined amount of time.

BRIEF DESCRIPTION OF THE DRAWINGS

The above and other features and advantages of the present invention will become more apparent to those of ordinary skill in the art by describing in detail exemplary embodiments thereof with reference to the attached drawings, in which:

FIG. 7 illustrates a deposition cycle of another embodiment of the present invention.

DETAILED DESCRIPTION OF THE INVENTION

Figure 1:
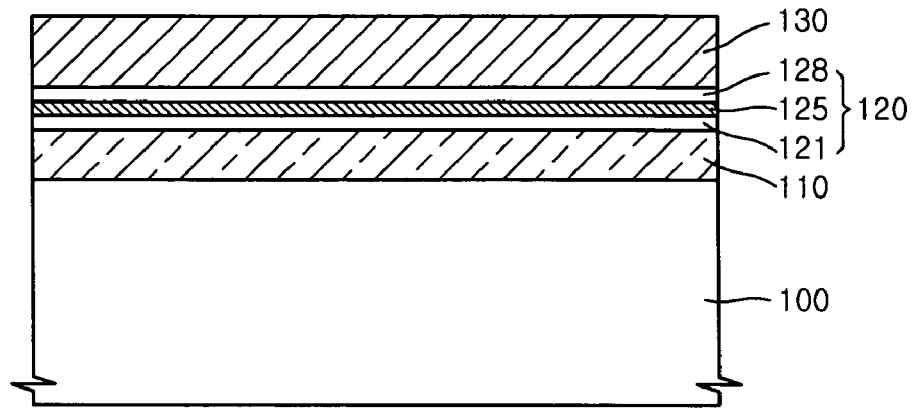
FIG. 1 illustrates a sectional view of a capacitor having a dielectric film formed according to an embodiment of the present invention.

Korean Patent Application No. 10-2005-0102498, filed on Oct. 28, 2005, in the Korean Intellectual Property Office, and entitled: "Method of Manufacturing Dielectric Film in Capacitor," is incorporated herein by reference in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of elements and regions may be exaggerated for clarity of illustration. It will also be understood that when a layer or element is referred to as being "on" another layer, element or substrate, it can be directly on the other layer, element or substrate, or intervening layers or elements may also be present. Further, it will be understood that when a layer or element is referred to as being "under" another layer or element, it can be directly under, or one or more intervening layers or elements may also be present. In addition, it will also be understood that when a layer or element is referred to as being "between" two layers or elements, it can be the only layer or element between the two layers or elements, or one or more intervening layers or elements may also be present. Like reference numerals refer to like layers or elements throughout.

An exemplary embodiment of a capacitor having a dielectric film formed according to the method of the present invention is illustrated in FIG. 1. A lower electrode 110 of a capacitor may be formed on an upper surface of a semiconductor substrate 100. Next, a first dielectric layer 121 with a high dielectric constant, a crystallization preventing layer 125, and a second dielectric layer 128 with a high dielectric constant may be sequentially deposited on the upper surface of the lower electrode 110 to form a dielectric film 120 in the capacitor. An upper electrode 130 may be interposed on top of the dielectric film 120.

The semiconductor substrate 100 may be made of a silicon wafer with a diameter of 300 nm, and it may include an integrated circuit (not shown). The lower electrode 110 may have a three-dimensional shape, e.g., cylindrical or concave shape, to secure high capacitance, and it may be made of metal nitrides, e.g., TiN, WN, TaN, and so forth, and/or precious metals, e.g., Ru, Pt, Ir, and so forth. The upper electrode 130 may be composed of the same material as the lower electrode 110 or of a different material.

The first and second dielectric layers 121 and 128 may be composed of the same material or different materials such as metal oxides having high dielectric constants, e.g., $HfO_2$, $ZrO_2$, $Ta_2O_5$, $TiO_2$, STO ($St_xBi_yTiO_x$), mixtures thereof, and the like. The crystallization preventing layer 125 may be a dielectric film having a crystallization temperature higher than the crystallization temperatures of the first and second dielectric layers 121 and 128. The crystallization preventing layer 125 may be composed of $Al_2O_3$, $La_2O_3$, $Pr_2O_3$, or a mixture thereof.

The three layers, 121, 125, and 128, may be sequentially deposited on a capacitor's lower electrode 110 by an ALD method to form a dielectric film 120. The ALD method may be done in a batch-type or a single-wafer-type process to provide uniform step coverage of the three-dimensional lower electrode 110.

In accordance with the present invention, the deposition of each layer of the dielectric film 120 may be controlled in terms of time length and material amount, such that the resulting dielectric film exhibits the desired electrical properties and low current leakage, while maintaining high throughput. Each layer of the dielectric film 120 may be deposited in one deposition cycle, whereas each deposition cycle may include a plurality of initial cycles and post cycles, each having a predetermined time length for depositing each of the precursor materials onto the lower electrode 110. In particular, an initial cycle of the present invention may be followed by at least one post cycle having a shorter predetermined time length, also referred to as supplying time, than the initial cycle. The post cycle may be repeated until the desired thickness of a layer is achieved. For example, a deposition cycle of one layer may include an initial cycle, supplying $HfO_2$ for 180 seconds and $O_3$ for 150 seconds, and several post cycles, supplying the same materials for 80 seconds each, until a desired thickness of the layer is achieved.

The number of post cycles may be greater than the number of initial cycles in one deposition cycle. In particular, the number of post cycles may be about 5 or about 10 times greater than the number of initial cycles, whereas the number of initial cycles in one deposition cycle may be from about 1 to about 5.

In accordance with the present invention, the precursor materials hereinafter may refer both to a metal source constituting the first deposited layer and to an oxidant source, e.g., ozone or oxygen, constituting the oxidizing layer deposited on the metal layer to form a metal-oxide dielectric layer. The metal source may be any one of 5-valent metals, such as Nb and Ta; 4-divalent metals, such as Zr, Hf, and Ti; 3-valent metals, such as Sc, Y, Al, Ga and In; 2-valent metal such as Ba, Sr and Ca; and Ln-based sources. It should be noted that when, for example, a Hf metal source is needed, it may be one of $Hf(OtBu)_4$, TEMAH (Tereakis Ethyl Methyl Amino Hafnium), TDMAH (Tetrakis Di-Methyl Amino Hafnium), TDEAH (Tetrakis Di-Ethyl Amino Hafnium), mixtures thereof, and like mixtures. Also, when a Zr metal source is needed, it may be one of $Zr(OtBu)_4$, TEMAZ (Tetrakis Ethyl Methyl Amino Zirconium), TDMAZ (Tetrakis Di-Ethyl Amino Zirconium), TDEAZ (Tetrakis Di-ethyl Amino Zirconium), mixtures thereof, and like mixtures.

According to the present invention, a sufficient amount of the precursor materials refers to an amount that is greater than the chemical stoichiometric amount required for forming a dielectric layer of the dielectric film 120. Accordingly, an amount of precursor materials that is "not sufficient" refers to the chemical stoichiometric amount required to form the desired dielectric layer of the dielectric film 120 or a lesser amount. The supplying time of the precursor materials may be adjusted to achieve the desired amount of precursor materials. It should also be noted that the "quantity of the precursor materials" may refer to the corresponding required supplying time.

In the initial cycle, the precursor materials are supplied at sufficient amounts for longer time periods, while in the post cycle, the precursor materials are supplied at lesser amounts for shorter time periods. Accordingly, during the initial cycle sufficient material covers the overall surface of the electrode to provide the desired electrical characteristics and/or leakage current properties, whereas by way of the characteristics of the post cycle, i.e., shorter supplying time, cost-effective throughput may be achieved. As such, no unfavourable electrical properties may result due to the shortened supplying time of the post cycle because of the sufficient materials provided in the initial cycle.

In accordance with the present invention, an exemplary method of manufacturing the layers 121, 125, and 128 which form the dielectric film 120 according to the present invention will be described in more detail hereinafter. It should be noted that in the exemplary embodiment discussed below a TiN layer may be used as an exemplary lower electrode 110, an $HfO_2$ layer may be used as an exemplary first and second metal oxide layers 121 and 128, an $Al_2O_3$ layer may be used as an exemplary crystallization preventing layer 125, and ozone may be used as an exemplary oxidizing agent. The use of the above specific examples does not limit or restrict the scope of the present invention in any way, and other materials known to those skilled in the art may be employed in a similar manner.

Figure 2A:
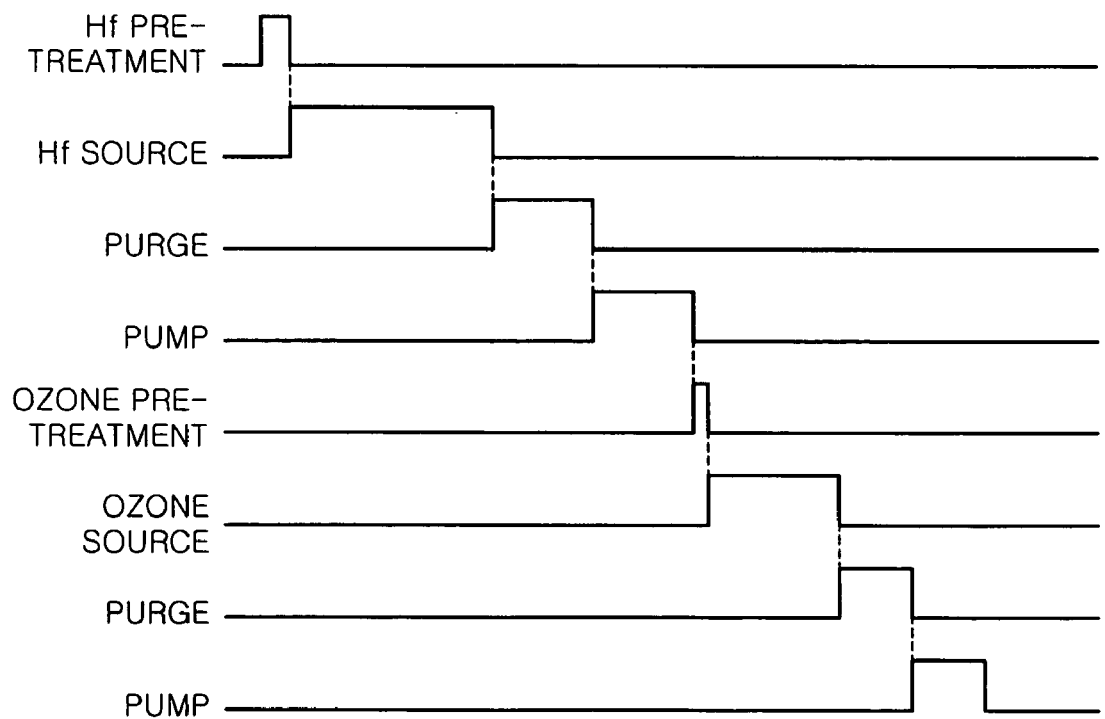
FIGS. 2A through 2C illustrate timelines of sequential stages in an initial cycle of a first layer of a dielectric film according to embodiments of the present invention.
Figure 2B:
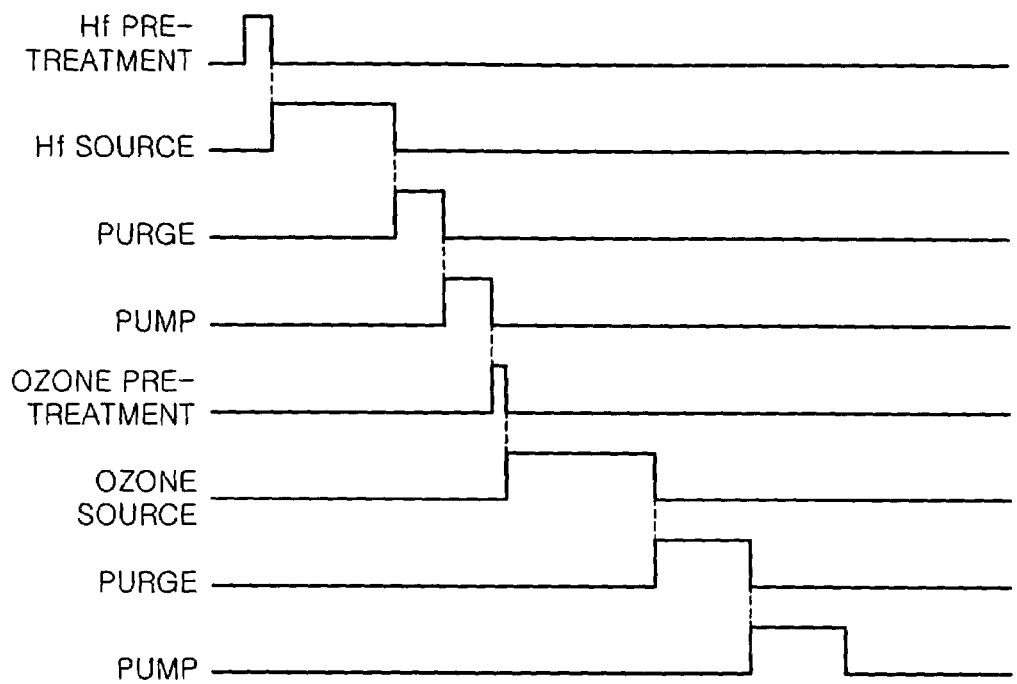
Figure 2C:
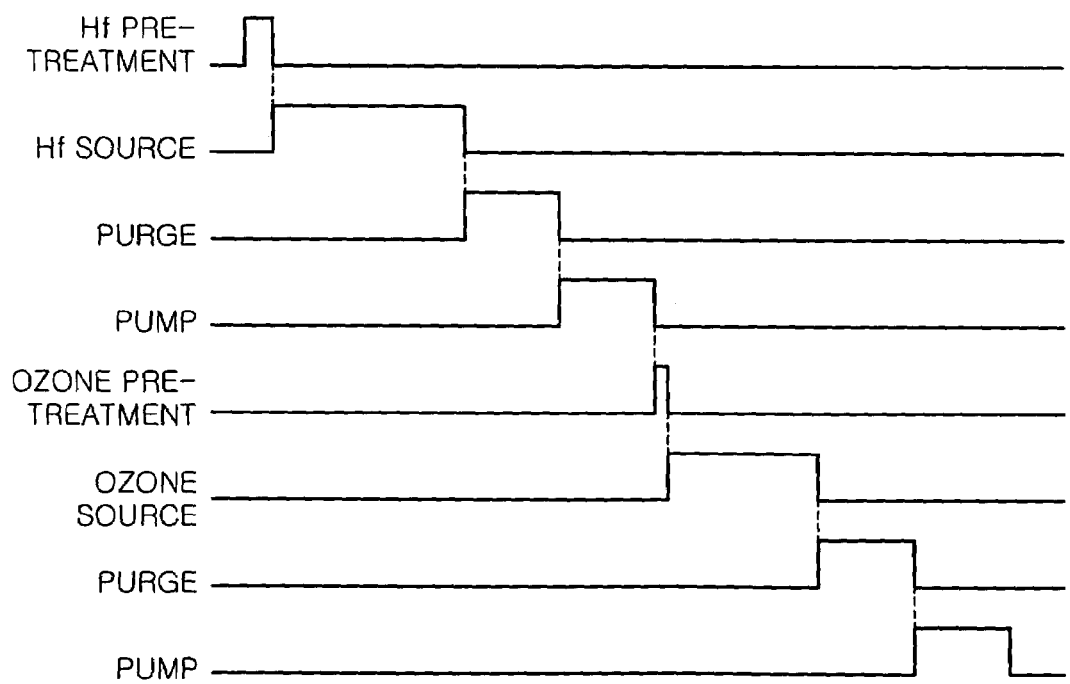
Figure 3:
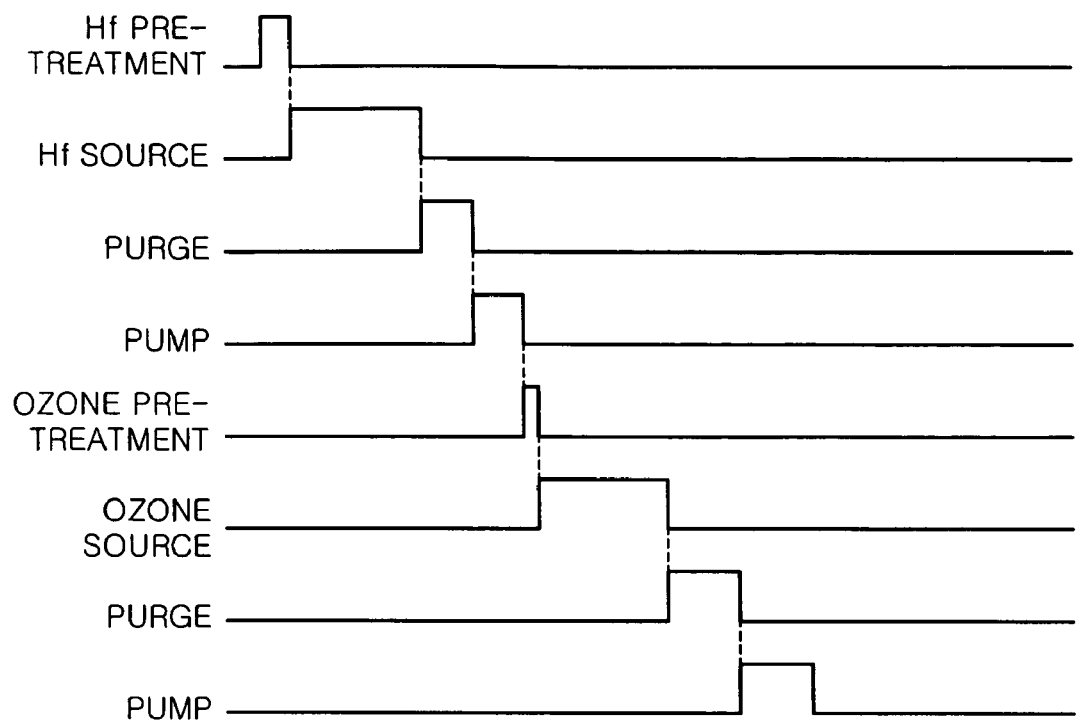
FIG. 3 illustrates a timeline of a post cycle of a first layer of a dielectric film according to an embodiment of the present invention.

Deposition of the first dielectric layer 121 by an ALD method according to the present invention is illustrated in FIGS. 2A through 3. In particular, a metal, e.g., Hf, may be supplied for pre-treatment in a vaporizer to transform it into vapour. This may be followed by supplying the vaporized metal as a precursor material into a processing chamber, having a lower electrode 110, for a predetermined amount of time, purging the processing chamber, pumping any remains of pure unitary atoms from the processing chamber, supplying an ozone source for pre-treatment in an ozonizer, supplying the ozone source as a precursor material into the same processing chamber for a predetermined amount of time, purging the processing chamber, and pumping it to chemically absorb any remaining pure unitary atoms. The pumping after the purging may be selectively carried out to improve the ALD process efficiency. This process may be repeated to form a deposition cycle having at least one initial cycle and at least one post cycle.

More particularly, as illustrated in an initial cycle of an embodiment of FIG. 2A, when depositing $HfO_2$ on a conventional 300 nm wafer, the deposition may start with vaporizing the Hf and subsequently supplying it to a processing chamber for an increased supply time of about 10 seconds to about 200 seconds. The ozone deposition may follow without an increase in its supplying time. By increasing the relative supplying time of the Hf source, its atoms may be evenly transferred to respective portions of the lower electrode uniformly covering its surface, such that the electrical properties of the dielectric film may be improved.

FIG. 2B illustrates a time line of another embodiment of the present invention, where only the supplying time of the ozone gas may be relatively increased. In this case, the supplying time of the ozone may be from about 100 seconds to about 200 seconds. By increasing the relative supplying time of the ozone source, the oxidizing reaction between the ozone and the Hf source may be enhanced, thereby reducing leakage current.

FIG. 2C illustrates a timeline of another embodiment of the present invention, where the supplying time of the Hf source as well as the ozone source may be increased to a time length of about 100 seconds to about 200 seconds. In this case, both the electrical properties and the leakage current characteristic may be enhanced.

During operation of the initial cycle, the Hf source and the ozone source may be pre-treated, i.e. transformed into a vaporized state, for a time length of about 2 seconds to about 10 seconds prior to supply into the processing chamber. The purging and pumping times may be set with respect to the supplying time of the corresponding precursor material. For example, when the Hf source and the ozone source are supplied for a relatively longer time of about 100 to about 200 seconds, the purging and pumping may be performed for about 50 seconds to about 100 seconds. However, when the Hf source and the ozone source are supplied for a relatively shorter period of time of about 50 to about 100 seconds, the purging and pumping may be performed for about 10 seconds to about 50 seconds.

Similarly, as illustrated in FIG. 3, the post cycle may include supplying the Hf source for pre-treatment of the vaporizer that transforms the Hf source from liquid to vapour, supplying the vaporized Hf source as a precursor material into a processing chamber, purging the processing chamber, pumping any remains of pure unitary atoms from the processing chamber, supplying an ozone source for pre-treatment of an ozonizer, supplying an ozone source as a precursor material into a processing chamber, purging the processing chamber, and pumping.

In the post cycle, the supplying time of the Hf source and the ozone source may be shorter than the corresponding step in the initial cycle. In particular, the supplying time in the post cycle may be from about 50 to about 80 seconds. The purging and the pumping may be shorter than the corresponding step in the initial cycle as well. In particular, the purging and the pumping times in the post cycle may be for about 10 seconds to about 50 seconds. The post cycle may begin after the initial cycle, and it may be repeated until the first dielectric layer, e.g. $HfO_2$, has a thickness of from about 10 Å to about 80 Å. The $HfO_2$ layer may be formed at a temperature of from about 150° C. to about 350° C.

Figure 4A:
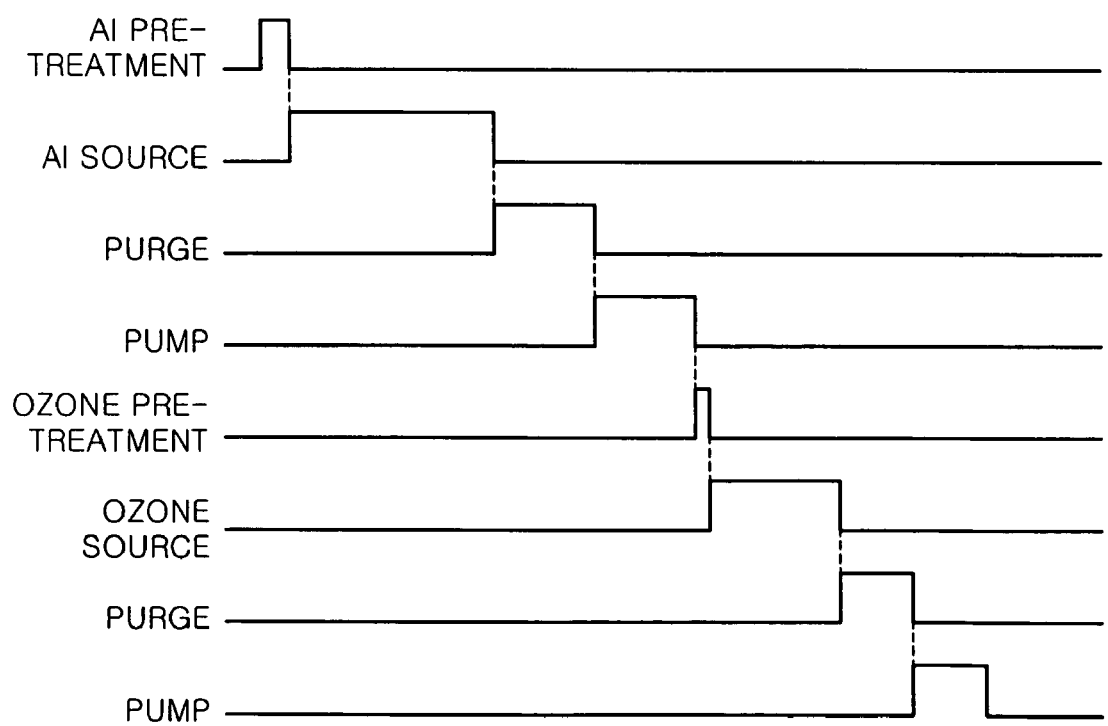
FIGS. 4A through 4C illustrate timelines of sequential stages in an initial cycle of a crystallization preventing layer of a dielectric film according to embodiments of the present invention.
Figure 4B:
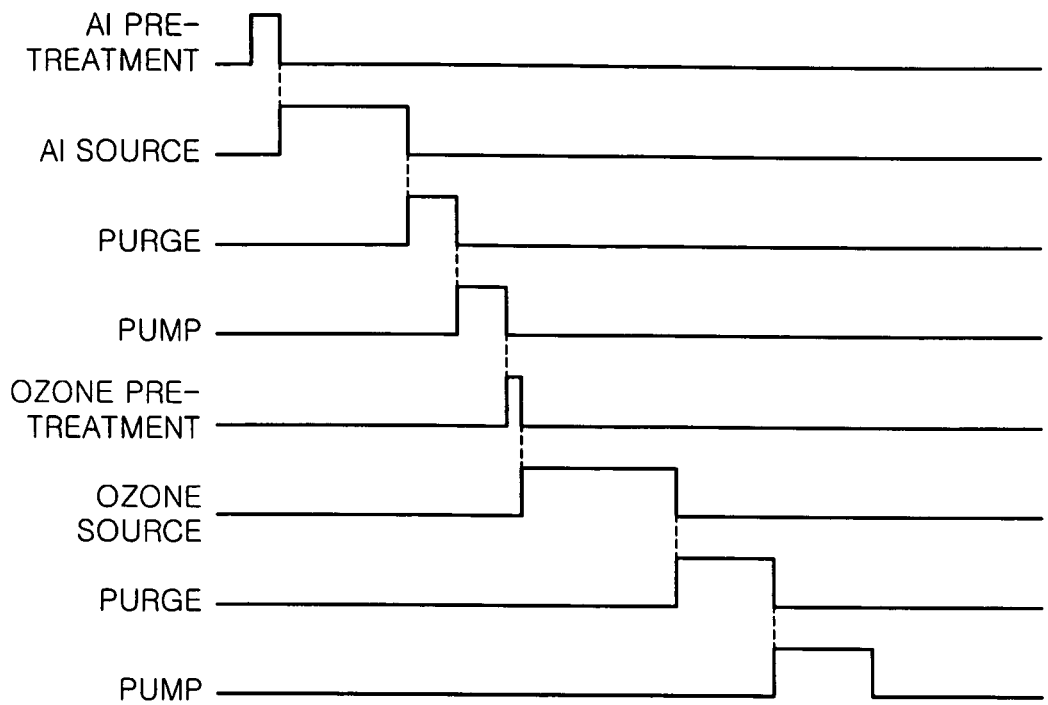
Figure 4C:
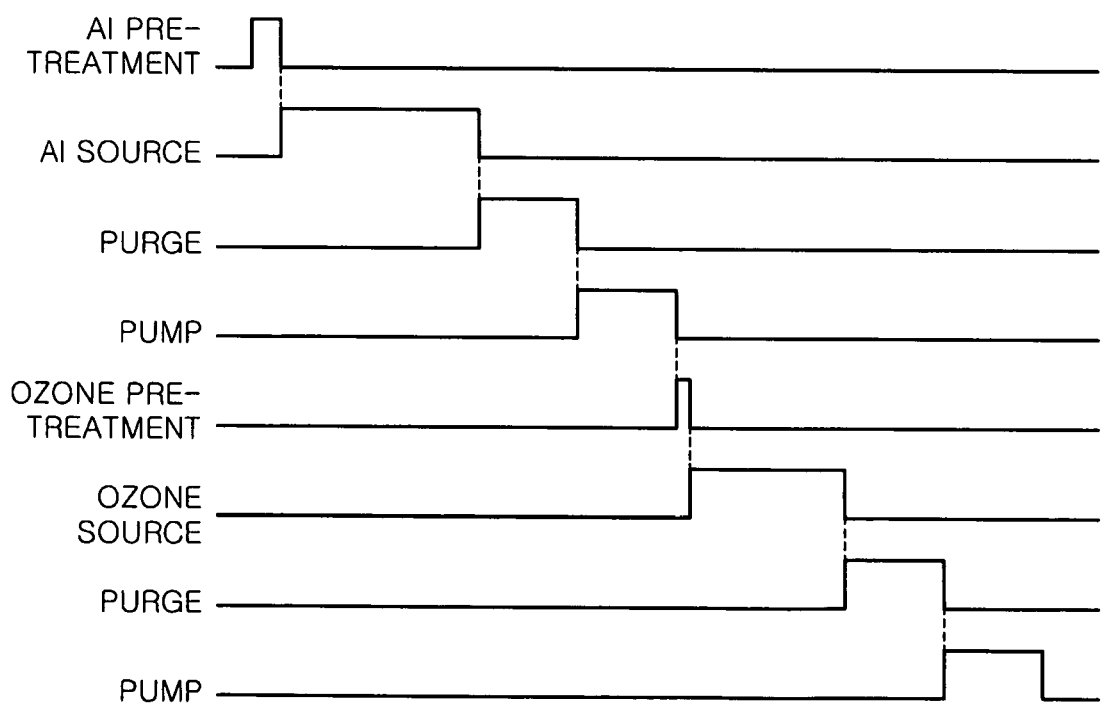
Figure 5:
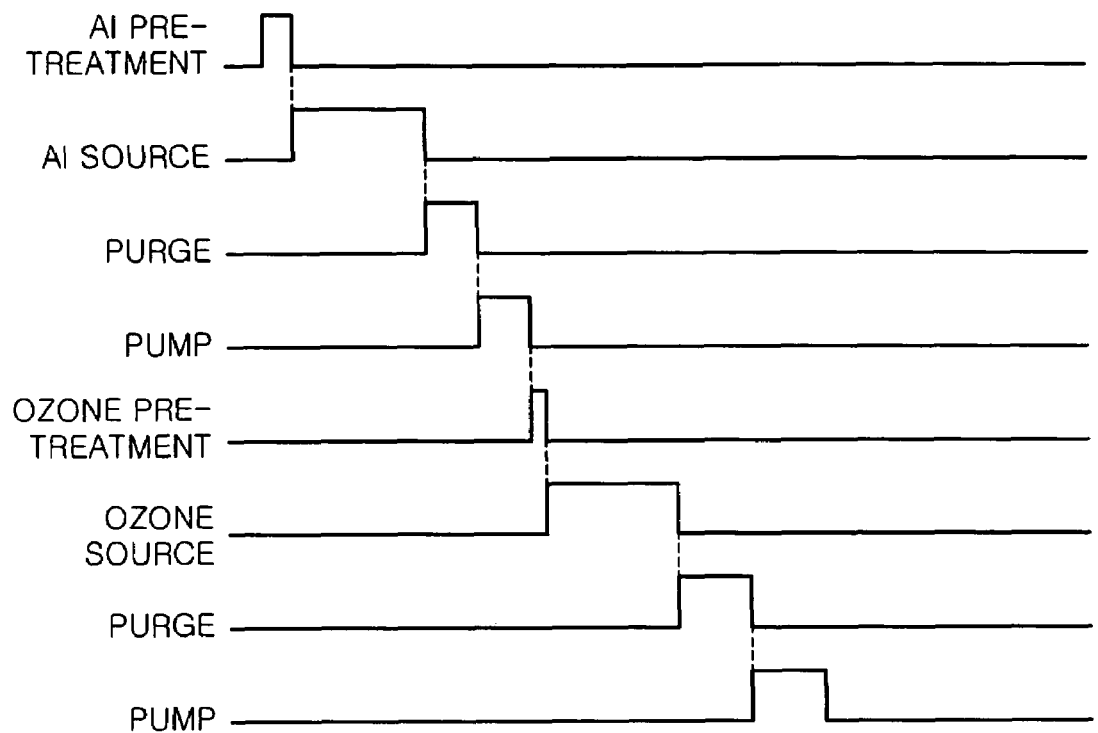
FIG. 5 illustrates a timeline of a post cycle of a crystallization preventing layer of a dielectric film according to an embodiment of the present invention.

The time-lines of the initial and post cycles providing the deposition of the crystallization preventing layer 125 according to the present invention are similarly illustrated in FIGS. 4A through 5. The crystallization preventing layer 125 may be formed on an upper surface of the first dielectric layer 121. As previously explained with respect to deposition of the first dielectric layer 121, the supplying time of the precursor materials of crystallization preventing layer 125 may be increased during the initial cycle and decreased during the post cycle.

For example, when $Al_2O_3$ is used as the crystallization preventing layer 125, the deposition cycle to manufacture the $Al_2O_3$ layer includes supplying an aluminium (Al) source for pre-treatment of a vaporizer that transforms the Al source from liquid to vapour, supplying the Al source as a reaction source, purging, pumping, supplying an ozone source for pre-treatment of an ozonizer, supplying the ozone source as a reaction source, purging, and pumping. As discussed previously with respect to deposition of a Hf layer, "purging" refers to purging of the processing chamber of remaining gases, and "pumping" refers to pumping of any remains of pure unitary atoms out of the processing chamber.

According to an embodiment illustrated in FIG. 4A, only the supplying time of the Al source may be relatively increased in the initial cycle to improve the electrical characteristic of the crystallization preventing layer 125. In another embodiment, the supplying time of the ozone source may be increased to improve the leakage current characteristic of the crystallization preventing layer 125 as illustrated in FIG. 4B. In yet another embodiment, as illustrated in FIG. 4C, the supplying time of the Al precursor as well as the ozone precursor may be increased, thereby simultaneously providing the desired electrical characteristics as well as the leakage current properties.

As illustrated in FIG. 5, in the post cycle following the initial cycle of depositing the crystallization preventing layer 125 of the present invention, the supplying time of the Al precursor and the supplying time of the ozone precursor may be decreased as compared with the corresponding supplying time of the initial cycle.

The second dielectric layer 128 may be formed on the upper surface of the crystallization preventing layer 125, and it may be formed similarly to the first dielectric layer 121. The second dielectric layer 128 may be formed as a third layer of the dielectric film 120, i.e., it may be formed on the upper surface of the combined first dielectric layer 121 and crystallization preventing layer 125, and therefore, may not substantially affect the step coverage of the dielectric film. Accordingly, the second layer 128 may be formed as the post cycle of the first dielectric layer 121, as illustrated in FIG. 3. The first dielectric layer 121, the crystallization preventing layer 125, and the second dielectric layer 128 may be formed ex-situ based on the properties of the layers.

Figure 7:
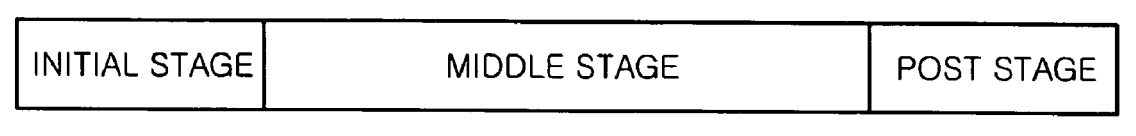

In another embodiment of the present invention, formation of the first dielectric layer 121, the crystallization preventing layer 125, and the second dielectric layer 128 into a dielectric film 120 may be divided into initial, middle and post cycles as illustrated in FIG. 7. In this embodiment, the supplying times of the precursor materials during the initial and the post cycles may be set to be greater than the supplying times during the middle cycle. According to this embodiment, the number of the initial and post cycles may be fewer than the number of the middle cycles, e.g., about 1 to about 5 times. For example, if the deposition cycle is set to perform a total of 27 cycles to form the desired dielectric film, the supplying time of the precursor materials during the initial and final cycles may be set to be supplied once during each cycle for a period of time greater than the supplying time of the precursor materials supplied for the 25 middle cycles. The supplying time of the precursor materials, e.g., the metal source and the oxidant, during the initial and post cycles of this embodiment may be the same as the supplying time of the precursor materials employed during the initial cycle of the embodiment lacking middle cycles.

When the supplying times of the precursor materials of both the initial and the post cycles are increased, a large amount of precursor materials may be deposited on the surface of the lower electrode of the capacitor during the initial cycle, such that the step coverage of the dielectric film may be improved to enhance the electrical characteristics of the capacitor. Additionally, a large amount of precursor materials may be deposited on the surface of the lower electrode of the capacitor during the post cycle, such that any impurities, e.g., carbons, of the dielectric film 120 may be eliminated, thereby improving the chemical stoichiometric ratio to further reduce the leakage current of the capacitor.

EXAMPLES

Comparative Examples 1-2 and Example 1 were conducted according to a batch-type ALD process using different deposition cycles to apply a dielectric film $HfO_2$ to a wafer. The deposition cycles used in Comparative Examples 1-2 are examples of methods known in the art, while Example 1 is an illustration of the inventive deposition cycle disclosed in the present invention.

In Comparative Example 1, throughputs of a deposition cycle having increased supplying times throughout the cycle for both precursor materials, e.g., Hf source and ozone source, were examined.

In Comparative Example 2, throughputs of a deposition cycle having decreased supplying times throughout the cycle for both precursor materials, e.g., Hf source and ozone source, were examined.

In Example 1, throughputs of a deposition cycle in accordance with an embodiment of the present invention, having increased supplying times for both precursor materials during the initial cycle and decreased supplying times in the post cycles, were examined.

Table 1 below summarizes the results of Comparative Examples 1-2 and Example 1:

TABLE 1

Conventional Art as Compared to the Present Invention

|  |  | Pre-treatment of $HfO_2$ | $HfO_2$ Source | Purge | Pump | Pre-treatment of $O_3$ | Ozone source | Purge | Pump | Total time | No. of Cycles | Throughput (wf/h) |
|---|---|---|---|---|---|---|---|---|---|---|---|---|
| Comparative Example 1 |  | 10 sec | 180 sec | 150 sec | 150 sec | 5 sec | 150 sec | 60 sec | 60 sec | 645 sec | 25 times | 13.1 (40 Å) |
| Comparative Example 2 |  | 10 sec | 80 sec | 30 sec | 30 sec | 5 sec | 80 sec | 40 sec | 40 sec | 315 sec | 27 times | 20.7 (40 Å) |
| Example 1 | 11th Time | 10 sec | 180 sec | 60 sec | 60 sec | 5 sec | 150 sec | 60 sec | 60 sec | 585 sec | 1 time | 20.2 |
|  | 26th Time | 10 sec | 80 sec | 30 sec | 30 sec | 5 sec | 80 sec | 40 sec | 40 sec | 315 sec | 26 times | (40 Å) |

As illustrated in Table 1, the throughputs of the $HfO_2$ layer formed in Comparative Examples 1 and 2 are compared to the throughputs of the $HfO_2$ layer formed in Example 1. As illustrated in Table 1, in Comparative Example 1, the supplying times of the precursor materials are increased throughout the entire cycle, thereby providing excellent electrical characteristic, i.e., step coverage, and leakage current properties of the dielectric film. However, despite the use of the batch-type ALD processing, the throughput of the process is about 13 wafers per hour, which is a rate that is almost equivalent to a single-wafer ALD processing.

As further illustrated in Table 1, in Comparative Example 2, the supplying times of the precursor materials are decreased throughout the entire cycle, thereby providing an increased throughput of about 20 wafers per hour. However, with such a decreased supplying time of the precursor materials, it may be difficult to provide the desired electrical properties of enhanced step coverage and reduced leakage current in a dielectric film.

Figure 6:
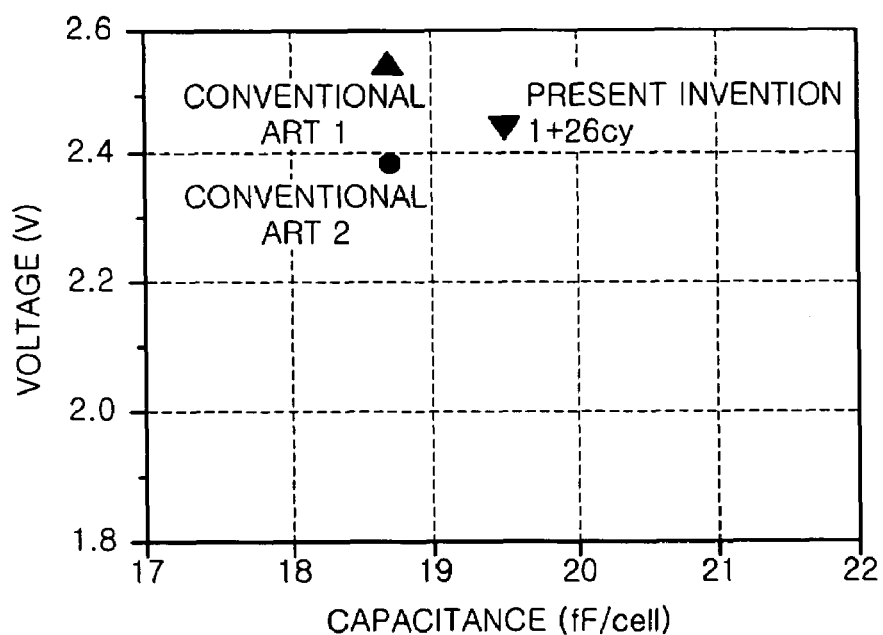
FIG. 6 illustrates a graphical representation of leakage currents in dielectric films formed according to known techniques as compared to the dielectric films formed according to the present invention.

FIG. 6 illustrates a comparison between levels of leakage current of dielectric films formed by Comparative Examples 1 and 2 and the present invention. Referring to FIG. 6, the x-axis denotes a capacitance (fF/cell) at about −0.9 V, and the y-axis denotes a voltage (V) that satisfies about 1 (fA/cell). The voltage that satisfies about 1 fA/cell represents the leakage current. Accordingly, as illustrated in FIG. 6, Comparative Example 2 produces more leakage current than Comparative Example 1.

As further illustrated in FIG. 6, the current leakage in a dielectric film formed in accordance with the present invention (Example 1) is lower than the leakage current of both Comparative Examples 1 and 2. Without intending to be bound by theory, this is achieved because the increased supplying time during the initial cycle and the decreased supplying time during the post cycle(s) of the present invention contribute to enhanced chemical absorption of precursor materials onto the surface of the electrode or layer, and thereby improve the step coverage and the leakage current.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a dielectric layer for a capacitor, comprising:

a. sequentially supplying a first precursor material and a second precursor material to a processing chamber in an initial cycle, wherein the supplying is carried out for a first predetermined amount of time and a second predetermined amount of time, respectively, and wherein the processing chamber is purged after each supplying is terminated;

b. sequentially supplying the first precursor material and the second precursor material to the processing chamber and purging it in a post cycle, wherein the post cycle follows the initial cycle, and wherein the supplying is carried out for a third predetermined amount of time; and c. repeating the initial and post cycles to form a first dielectric layer, wherein a number of initial cycles is smaller than a number of post cycles, and wherein a predetermined amount of time of supplying at least one of the first and second precursor materials in the initial cycle is longer than the third predetermined amount of time.

2. The method as claimed in claim 1, wherein supplying of first and second precursor materials in the initial cycle comprises supplying the first and second precursor materials in amounts greater than their corresponding chemical stoichiometric amounts.

3. The method as claimed in claim 1, wherein supplying the first and second precursor materials in the post cycle comprises supplying the first and second precursor materials in amounts equal to or less than their corresponding chemical stoichiometric amounts.

4. The method as claimed in claim 1, wherein supplying at least one of the first and second precursor materials in the initial cycle is carried out for the predetermined amount of time of about 100 seconds to about 200 seconds.

5. The method as claimed in claim 1, wherein the third predetermined amount of time is about 50 seconds to about 100 seconds.

6. The method as claimed in claim 1, wherein the initial and post cycles are repeated to form a first dielectric layer having a thickness of about 10 Å to about 80 Å.

7. The method as claimed in claim 6, wherein forming the first dielectric layer further comprises maintaining a temperature of about 150° C. to about 350° C.

8. The method as claimed in claim 1, further comprising pre-treating the first and second precursor materials prior to supplying them to the processing chamber, such that the first and second precursor materials are vaporized.

9. The method as claimed in claim 1, further comprising repeating steps (a) and (b) to form a crystallization preventing layer on top of the first dielectric layer, and wherein a predetermined amount of time of supplying at least one of the first and second precursor materials in the initial cycle is longer than the third predetermined amount of time.

10. The method as claimed in claim 9, further comprising repeating steps (a) and (b) to form a second dielectric layer on top of the crystallization preventing layer.

11. The method as claimed in claim 9, further comprising repeating step (b) to form a second dielectric layer on top of the crystallization preventing layer.

12. The method as claimed in claim 1, wherein a total number of repeated initial cycles is about 5 to about 10 times smaller than a total number of repeated post cycles.

13. The method as claimed in claim 1, wherein the dielectric layer is formed in a batch-type process.

14. The method as claimed in claim 1, wherein the first precursor material is one of $Hf(OtBu)_4$, Tereakis Ethyl Methyl Amino Hafnium (TEMAH), Tetrakis Di-Methyl Amino Hafnium (TDMAH), Tetrakis Di-Ethyl Amino Hafnium (TDEAH), $Zr(OtBu)_4$, Tetrakis Ethyl Methyl Amino Zirconium (TEMAZ), Tetrakis Di-Ethyl Amino Zirconium (TDMAZ), Tetrakis Di-ethyl Amino Zirconium (TDEAZ), or mixtures thereof.

15. The method as claimed in claim 1, wherein the second precursor material is ozone, oxygen, or a mixture thereof.

16. The method as claimed in claim 1, wherein the first dielectric layer is one of $HfO_2$, $ZrO_2$, $Ta_2O_5$, $TiO_2$, STO ($St_xBi_yTiO_x$), or a mixture thereof.

17. A method of manufacturing a dielectric film for a capacitor by way of atomic layer deposition (ALD), comprising:
   a. sequentially supplying a vaporized metal and oxidizing agent to an electrode in an initial cycle, wherein the supplying is carried out for a first predetermined amount of time and a second predetermined amount of time, respectively, and wherein the vaporized metal and oxidizing agent are purged after the supplying is terminated;
   b. sequentially supplying the vaporized metal and oxidizing agent to the electrode in a post cycle, wherein the post cycle follows the initial cycle, and wherein the supplying is carried out for a third predetermined amount of time;
   c. repeating the initial and post cycles to form a first metal-oxide dielectric layer, wherein a number of initial cycles is smaller than a number of post cycles, and wherein a predetermined amount of time of supplying at least one of the vaporized metal and oxidizing agent in the initial cycle is longer than the third predetermined amount of time;
   d. repeating (a) and (b) to form a crystallization preventing layer on top of the first metal-oxide dielectric layer, wherein a number of initial cycles is smaller than a number of post cycles, and wherein a predetermined amount of time of supplying at least one of the first and second precursor materials in the initial cycle is longer than the third predetermined amount of time; and
   e. repeating (b) to form a second metal-oxide dielectric layer on top of the crystallization preventing layer.

18. The method as claimed in claim 17, further comprising pumping remains of unitary atoms after purging of the vaporized metal and oxidizing agent.

19. The method as claimed in claim 18, wherein the purging and the pumping are set to correspond to the respective predetermined amounts of time of the vaporized metal and oxidizing agent.

20. The method as claimed in claim 17, further comprising at least one middle cycle between the initial cycle and the post cycle, the middle cycle including sequentially supplying the vaporized metal and oxidizing agent to the electrode for a fourth predetermined amount of time and purging them, wherein the fourth predetermined amount of time is shorter than any other predetermined amount of time.

* * * * *